(12) United States Patent
Caspary et al.

(10) Patent No.: US 10,724,148 B2
(45) Date of Patent: Jul. 28, 2020

(54) SILICON INGOT AND METHOD OF MANUFACTURING A SILICON INGOT

(71) Applicant: Infineon Technologies AG, Neubiberg (DE)

(72) Inventors: Nico Caspary, Munich (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 535 days.

(21) Appl. No.: 14/160,124

(22) Filed: Jan. 21, 2014

(65) Prior Publication Data

US 2015/0203988 A1    Jul. 23, 2015

(51) Int. Cl.
| | | |
|---|---|---|
| *C30B 15/04* | (2006.01) | |
| *C30B 29/06* | (2006.01) | |
| *C30B 15/20* | (2006.01) | |

(52) U.S. Cl.
CPC .............. *C30B 15/04* (2013.01); *C30B 15/20* (2013.01); *C30B 29/06* (2013.01)

(58) Field of Classification Search
CPC .......... C30B 15/04; C30B 15/20; C30B 29/06
See application file for complete search history.

(56) References Cited

U.S. PATENT DOCUMENTS

| | | | |
|---|---|---|---|
| 2,861,905 A | 11/1958 | Indig et al. | |
| 5,656,077 A * | 8/1997 | Kawase | C30B 11/00 117/200 |
| 5,976,247 A | 11/1999 | Hansen et al. | |
| 6,179,914 B1 | 1/2001 | Aydelott et al. | |
| 8,105,463 B2 | 1/2012 | Goulet et al. | |
| 2011/0030793 A1 | 2/2011 | Kraiem et al. | |
| 2011/0129784 A1 | 6/2011 | Bange et al. | |
| 2012/0056135 A1 * | 3/2012 | DeLuca | C30B 15/04 252/512 |
| 2012/0301386 A1 * | 11/2012 | Johnson | C30B 15/04 423/348 |
| 2014/0026617 A1 | 1/2014 | Yakub et al. | |

FOREIGN PATENT DOCUMENTS

| | | |
|---|---|---|
| CN | 1041011 A | 4/1990 |
| CN | 1649092 A | 8/2005 |
| CN | 101173369 A | 5/2008 |
| CN | 101654804 A | 2/2010 |
| CN | 101792933 A | 8/2010 |
| CN | 101918314 A | 12/2010 |
| CN | 101999013 A | 3/2011 |
| CN | 102912424 A | 2/2013 |
| CN | 102978698 A | 3/2013 |
| CN | 103088407 A | 5/2013 |
| DE | 1215658 B | 5/1966 |
| DE | 3806918 A1 | 9/1989 |
| DE | 102015100393 A1 | 7/2015 |
| DE | 102014107590 B3 | 10/2015 |
| GB | 921037 A | 3/1963 |
| JP | H04243995 A | 9/1992 |
| JP | 2012136398 A | 7/2012 |
| RU | 2023769 | * 11/1994 |

OTHER PUBLICATIONS

RU 2023769 machine translation.*
RU 2023769 Translation.*
Translation of RU2023769.*
Silicon Crystal Growth by the Electromagnetic Czochralski (EMCZ) Method, Watanabe et al , Jpn. J. Appl. Phys. vol. 38 (1999) pp. L 10-L 13.*

* cited by examiner

*Primary Examiner* — Haidung D Nguyen
(74) *Attorney, Agent, or Firm* — Murphy, Bilak & Homiller, PLLC

(57) ABSTRACT

A method of Czochralski growth of a silicon ingot includes melting a mixture of silicon material and an n-type dopant material in a crucible. The silicon ingot is extracted from the molten silicon over an extraction time period. Boron is added to the molten silicon over at least part of the extraction time period.

11 Claims, 3 Drawing Sheets

SILICON INGOT AND METHOD OF MANUFACTURING A SILICON INGOT

BACKGROUND

Silicon wafers grown by the Czochralski (CZ) method, e.g. by the standard CZ method or by the magnetic CZ (MCZ) method or by the Continuous CZ (CCZ) method serve as a base material for manufacturing a variety of semiconductor devices and integrated circuits such as power semiconductor devices and solar cells. In the Czochralski method, silicon is heated in a crucible to the melting point of silicon at around 1416° C. to produce a melt of silicon. A small silicon seed crystal is brought in contact with the melt. Molten silicon freezes on the silicon seed crystal. By slowly pulling the silicon seed crystal away from the melt, a crystalline silicon ingot is grown with a diameter in the range of one or several 100 mm and a length in the range of a meter or more. In the MCZ method, additionally an external magnetic field is applied to reduce an oxygen contamination level.

Growing of silicon with defined doping by the Czochralski method is complicated by segregation effects. The segregation coefficient of a dopant material characterizes the relation between the concentration of the dopant material in the growing crystal and that of the melt. Typically, dopant materials have segregation coefficients lower than one meaning that the solubility of the dopant material in the melt is larger than in the solid. This typically leads to an increase of doping concentration in the ingot with increasing distance from the seed crystal.

Since in Czochralski grown silicon ingots, depending upon application of the grown silicon, a tolerance range of doping concentration or specific resistance along the axial direction between opposite ends of the silicon ingot may be smaller than the variability of doping concentration or specific resistance caused by segregation effects during CZ growth, it is desirable to provide a method of manufacturing a silicon ingot grown by the Czochralski method that allows for an improved axial homogeneity of specific resistance.

SUMMARY

An embodiment refers to a method of Czochralski growth of a silicon ingot. The method comprises melting a mixture of silicon material and an n-type dopant material in a crucible. The method further comprises extracting the silicon ingot from the molten silicon over an extraction time period. The method further comprises adding boron to the molten silicon over at least part of the extraction time period.

Another embodiment refers to an n-doped silicon ingot. The n-doped silicon ingot comprises, along an axis between opposite ends of the silicon ingot, partial compensation where donors outnumber boron, and a segregation coefficient of at least one n-type dopant species of the donors is smaller than the segregation coefficient of boron.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
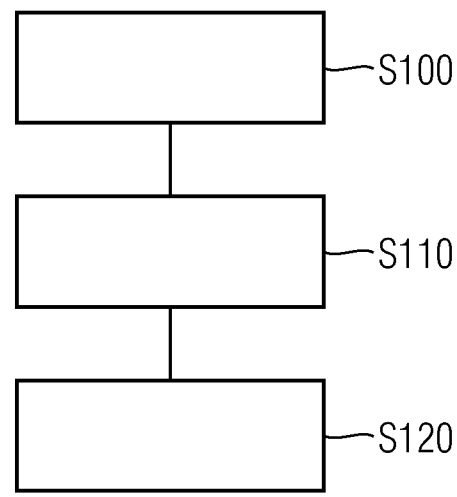
FIG. 1 is a schematic flow chart for illustrating a method of manufacturing an n-type silicon ingot.

FIG. 1 refers to a method of manufacturing a silicon ingot.

Process feature S100 of the method comprises melting a mixture of silicon material and an n-type dopant material in a crucible.

Process feature S110 of the method comprises extracting the silicon ingot from the molten silicon over an extraction time period.

Process feature S120 of the method comprises adding boron to the molten silicon over at least part of the extraction time period.

Figure 2:
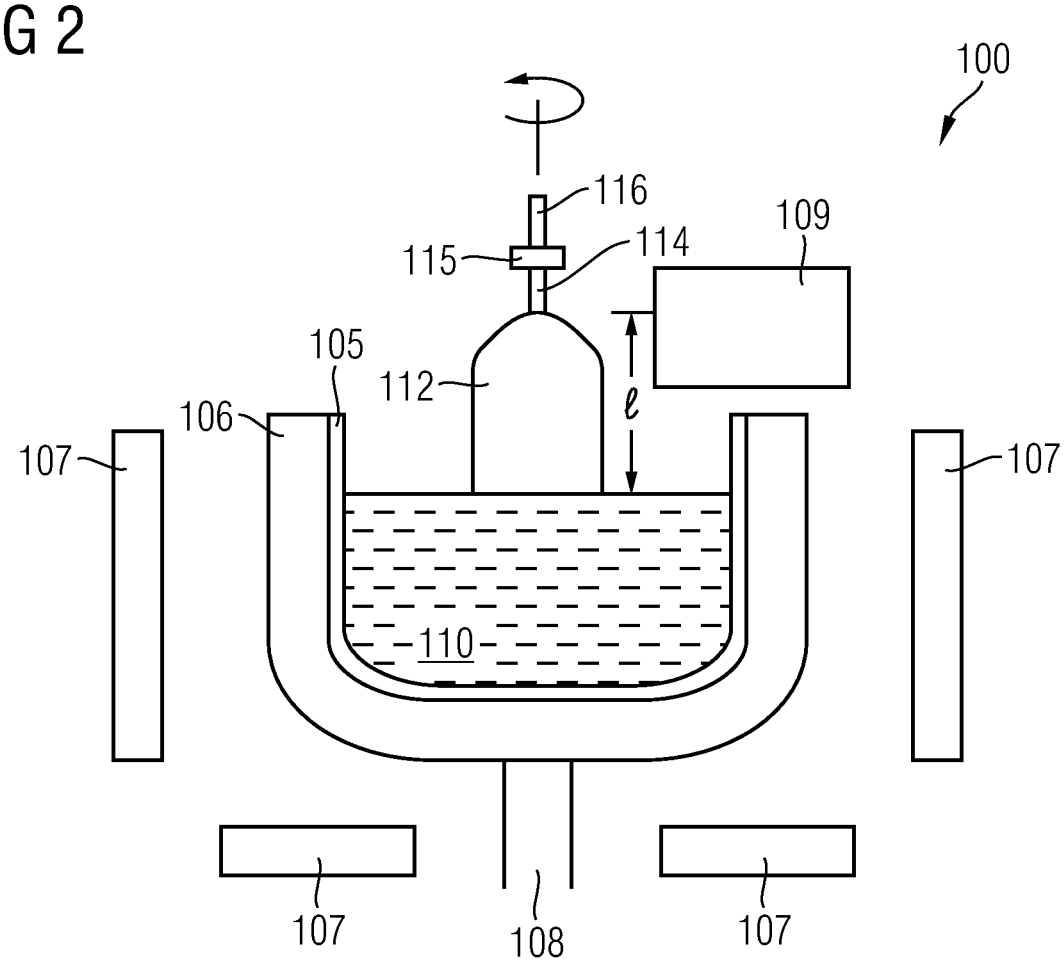
FIG. 2 is a schematic cross-sectional view of a CZ growth system for carrying out the method illustrated in FIG. 1.

FIG. 2 is a simplified schematic cross-sectional view of a CZ growth system 100 for carrying out the method illustrated in FIG. 1.

The CZ growth system 100 includes a crucible 105, e.g. a quartz crucible on a crucible support 106, e.g. a graphite susceptor. A heater 107, e.g. a radio frequency (RF) coil surrounds the crucible. The heater 107 may be arranged at lateral sides and/or at a bottom side of the crucible 105. The crucible 105 may be rotated by a supporting shaft 108.

The mixture of silicon material, e.g. a non-crystalline raw material such as polysilicon and an n-type dopant material such as phosphorus (P), antimony (Sb), arsenic (As) or any combination thereof is melted in the crucible by heating via the heater 107. The n-type dopant material may already constitute or be part of the initial doping of the silicon material to be melted and/or may be added as a solid or gaseous dopant source material. According to an embodiment, the solid dopant source material is a dopant source particle such as a dopant source pill. The dopant source material may have a predetermined shape such as a disc shape, spherical shape or a cubic shape. By way of example, the shape of the dopant source material may be adapted to a supply device 109 such as a dispenser configured to supply the dopant source material to a silicon melt 110 in the crucible 105.

According to an embodiment, the dopant source material may include, in addition to the dopant material, a carrier material or a binder material. By way of example, the dopant source material may be quartz or silicon carbide (SiC) doped with the dopant material. According to another embodiment, the dopant source material may be a highly doped silicon material such as a highly doped polysilicon material that is doped to a greater extent than the silicon raw material. According to yet another embodiment, the dopant source material may be boron nitride and/or boron carbide.

A silicon ingot 112 is pulled out of the crucible 105 containing the silicon melt 110 by dipping a seed crystal 114 into the silicon melt 110 which is subsequently slowly withdrawn at a surface temperature of the melt just above the melting point of silicon. The seed crystal 114 is a single crystalline silicon seed mounted on a seed support 115 rotated by a pull shaft 116. A pulling rate which typically is in a range of a few mm/min and a temperature profile influence a diameter of the CZ grown silicon ingot 112.

Figure 3:
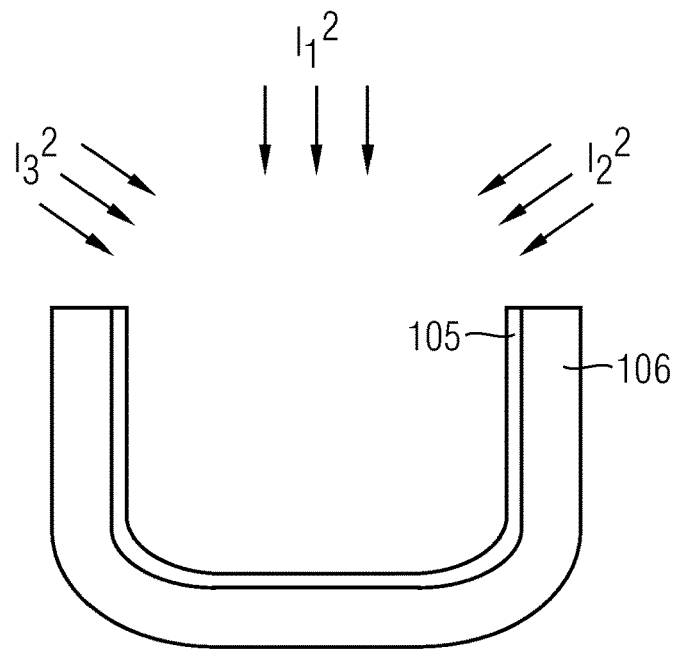
FIG. 3 is a schematic cross-sectional view of a crucible for illustrating a method of doping the crucible with dopant material.

When extracting the silicon ingot 112 with the CZ growth system 100 according to the method illustrated in FIG. 1, boron is added to the silicon melt 110 over an extraction time period. According to an embodiment, boron is added to the molten silicon at a constant rate. The boron may be added to the silicon melt 110 from a boron doped quartz material such as a boron doped quartz material supplied to the silicon melt 110 by the supply device 109. In addition or as an alternative, the boron may be added to the silicon melt 110 from a boron carbide or from a boron nitride source material that may also be supplied to the silicon melt 110 by the supply device 109. According to another embodiment, the boron is added to the silicon melt 100 from a boron doped crucible. The boron doped crucible may be formed by implanting boron into the crucible, for example (cf. schematic cross-sectional view of FIG. 3). The boron may be implanted into the crucible 105 by one or more tilted implants, cf. labels $I_2^2$ and $I_3^2$ and/or by non-tilted implant, cf. label $I_1^2$ in FIG. 3. A distribution of tilt angle(s) may be used to adjust the amount of boron that is supplied to the silicon melt 110 by dissolving a material of the crucible 105 in the silicon melt 110, e.g. at a rate in the range of approximately 10 μm/hour in case of a crucible made of quartz. The boron may be implanted into the crucible at various energies and/or at various doses. Applying a thermal budget to the crucible 105 by heating may allow for setting a retrograde profile of the boron in the crucible 105. Multiple implants at various energies and/or doses further allow for setting a profile of the boron into a depth of the crucible 105. Thus, a rate of adding boron into the silicon melt 110 may be adjusted, i.e. by selection of implantation parameters the rate of the addition of boron can be varied and controlled in a well-defined manner. By way of example, the profile of boron in the crucible 105 may be a retrograde profile. As an alternative or in addition to implanting boron into the crucible 105, boron may also be introduced into the crucible 105 by another process, e.g. by diffusion from a diffusion source such as a solid diffusion source of boron, for example. As a further alternative or in addition to the above processes of introducing boron into the crucible 105, boron may also be introduced into the crucible 105 in-situ, i.e. during formation of the crucible 105.

According to yet another embodiment boron may be introduced into the silicon melt 110 from the gas phase, e.g. by supply of diborane ($B_2H_6$) via the supply device 109. According to an embodiment, supply of boron in the gas phase may occur via a supply of inert gas into the CZ growth system 100. According to another embodiment, supply of boron in the gas phase may occur via one or more tubes, e.g. a quartz tube extending into the silicon melt 110. According to yet another embodiment, supply of boron in the gas phase may occur via one or more tubes ending at a short distance to the silicon melt 110. The tubes may include one or more openings at an outlet, e.g. in the form of a showerhead, for example.

According to another embodiment, a liner layer may be formed on the crucible 105 for controlling diffusion of boron out of the crucible 105 into the silicon melt 110. As an example, the liner layer may be formed of quartz and/or silicon carbide. According to an embodiment, the liner layer may be dissolved in the silicon melt 100 before boron included in the crucible gets dissolved in the silicon melt 110 and serves as a dopant during the growth process of the silicon ingot 112. This allows for adjusting a point of time when boron is available in the silicon melt as a dopant to be introduced into the silicon ingot 112. The liner layer may also delay introduction of boron into the silicon melt 110 by a time period that is required for diffusion of boron from the crucible 105 through the liner layer and into the silicon melt 110.

According to another embodiment, the method of manufacturing the silicon ingot 112 further includes altering a rate of adding the boron to the silicon melt 110. According to an embodiment, altering the rate of adding the boron to the silicon melt 110 includes altering at least one of size, geometry, and rate of delivery of particles including the boron. By way of example, the rate may be increased by increasing a diameter of the particles doped with the dopant material. As an additional or alternative measure, the rate of adding the boron to the silicon melt 110 may be increased by increasing a speed of supplying the dopant source material into the silicon melt 110 by the supply device 109.

Figure 4:
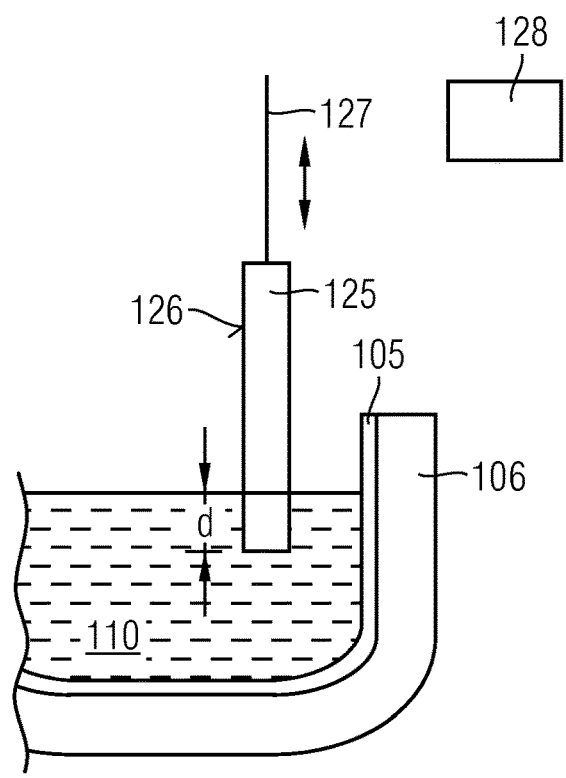
FIG. 4 is a schematic cross-sectional view of a part of a CZ growth system for illustrating a method of adding dopants to a silicon melt in the crucible.

According to another embodiment illustrated in the schematic cross-sectional view of FIG. 4, altering the rate of adding the boron to the silicon melt 110 includes altering a depth d of a dopant source material 125 dipped into the silicon melt 110.

According to another embodiment, altering the rate of adding the boron to the silicon melt 110 includes altering a temperature of the dopant source material 125. By way of example, by increasing a temperature of the dopant source material, e.g. by heating, the amount of boron introduced into the silicon melt 110 out of the dopant source material 125 may be increased. The dopant source material 125 is doped with the boron. According to an embodiment, doping of the dopant source material is carried out by one of in-situ doping, by a plasma deposition process through a surface 126 of the dopant source material 125, by ion implantation through the surface 126 of the dopant source material 125 and by a diffusion process through the surface 126 of the dopant source material 125. The dopant source material 125 may be shaped as a bar, a cylinder, a cone or a pyramid, for example. The dopant source material 125 may also be made of a plurality of separate dopant source pieces having one or a combination of different shapes. The depth d of a part of the dopant source material 125 that is dipped into the silicon melt 110 may be changed by a puller mechanism 127. The puller mechanism 127 holds the dopant source material 125, dips the dopant source material 125 into the silicon melt 110 and also pulls the dopant source material 125 out of the silicon melt 110. A control mechanism 128 is configured to control the puller mechanism 127. The control mechanism 128 may control the puller mechanism 127 by wired or wireless control signal transmission, for example.

According to another embodiment, altering the rate of adding the boron to the silicon melt 110 includes altering a flow or partial pressure of a boron carrier gas, e.g. diborane ($B_2H_6$) when doping the silicon melt 110 with boron from the gas phase.

According to an embodiment, the rate of adding the boron to the silicon melt 110 may be controlled depending on a length of the silicon ingot 112 from the seed crystal 114 to the silicon melt 110 during growth. According to another embodiment, the rate of adding the boron to the silicon melt 110 may be controlled based on a result of measuring a weight of the silicon ingot 112 and/or the dopant source material 125 during the Czochralski growth process. By way of example, the weight of the silicon ingot 112 and/or the dopant source material 125 may be measured by hanging up the silicon ingot 112 and/or the dopant source material 125 at a weighting unit, for example.

According to another embodiment, controlling the rate of adding the boron to the silicon melt 110 is carried out by optically measuring a change in dimensions of a quartz source material doped with the boron. Entrance of measurement light into the quartz source material may occur through a part of the quartz source material that protrudes from the silicon melt 110, for example. Altering the rate of adding the boron to the silicon melt 110 may also be carried out by altering at least one of a contact area between a dopant source material and the silicon melt and heating of the dopant source material. By altering the rate of adding boron to the silicon melt 110, an axial gradient of doping may be minimized, e.g. to a value less than 50%, or less than 20% or even less than 10%.

The method for manufacturing the silicon ingot 112 described above includes a partial compensation where donors in the n-doped silicon ingot 112 outnumber boron that is added to the silicon melt 110 during CZ growth.

An axial profile of doping caused by segregation of dopant material during CZ growth can be approximated by equation (1) below:

$$c(p) = k_0 c_0 (1-p)^{k_0 - 1} + F_0 \frac{k_0}{1 - k_0}[(1-p)^{k_0 - 1} - 1] \quad (1)$$

The first term in the equation (1) refers to a doping that has been added to the melt before extracting the silicon ingot from the melt. According to the above embodiments, n-type dopant materials may be described by the first term of equation (1). The second term refers to adding dopant material at a constant rate into the melt during CZ growth. According to the above embodiments, adding the boron may be described by the second term of equation (1).

In the above equation (1), c(p) denotes a concentration of the dopant material in the silicon ingot (atoms/cm³), p denotes a portion of the initial melt during CZ growth that has been crystallized and corresponds to an axial position between 0% and 100% of the completely grown silicon ingot, $k_0$ denotes a segregation coefficient of the dopant material, e.g. approx. 0.8 for boron (B) in silicon and approx. 0.35 for phosphorus (P) in silicon, $c_0$ denotes an initial concentration of the dopant material in the melt (atoms/cm³) and $F_0$ denotes a total amount of the dopant material that is constantly (relative to the pulling rate) added to the melt divided by the initial volume of the melt (atoms/cm³).

Figure 5:
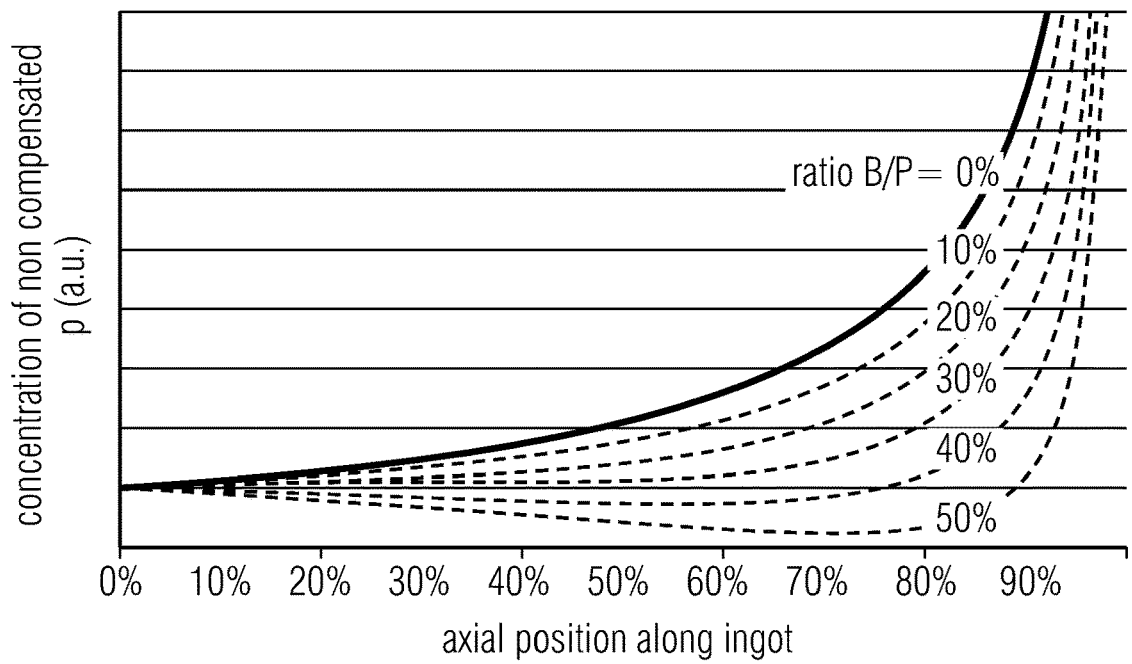
FIG. 5 is a graph illustrating a simulated concentration of non-compensated phosphorus along an axial position of a CZ grown silicon ingot with respect to different ratios of boron and phosphorus added to the silicon melt.

FIG. 5 illustrates calculated concentrations of non-compensated phosphorus (P), i.e. net n-doping versus an axial position between opposite ends of a silicon ingot. The illustrated curves refer to different ratios of boron (B) and phosphorus (P), i.e. $F_{OB}/c_{OP}$ corresponding to the ratio of the total amount of boron that is constantly (relative to the pulling rate) added to the silicon melt divided by the initial volume of the melt ($F_{OB}$ in atoms/cm³) and an initial concentration of phosphorus in the melt ($c_{OP}$ in atoms/cm³).

The illustrated curves refer to values of $F_{OB}/c_{OP}$ of 0%, 10%, 20%, 30%, 40%, 50%. By adding boron to the melt during CZ growth and thereby adding a compensation dopant to the melt during the CZ growth, the method described with reference to FIGS. 1 to 4 allows for improving homogeneity of the net n-doping concentration along the axial direction between opposite ends of the silicon ingot. When adding the boron to the melt before initiating CZ growth of the silicon ingot, homogeneity of the net n-doping concentration along the axial direction between opposite ends of the silicon ingot may be even worse than for the case of $F_{OB}/c_{OP}$ of 0%, i.e. without adding boron. This is due to the larger segregation coefficient of the compensation dopant boron compared to the segregation coefficient of the n-type dopant such as phosphorus.

Figure 6:
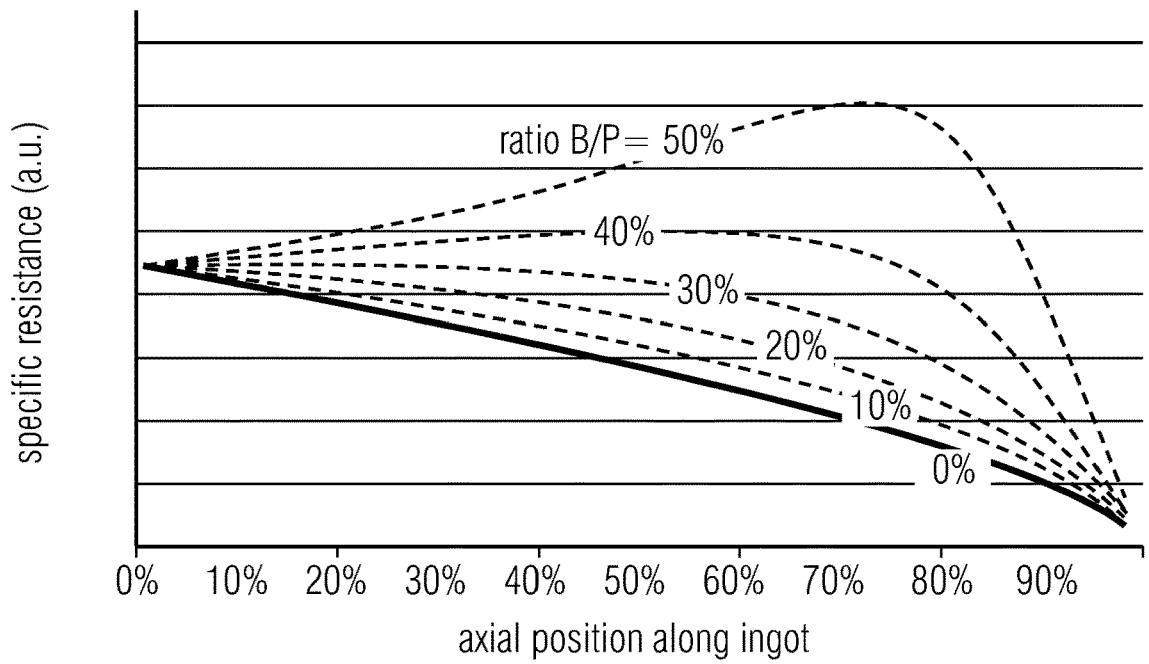
FIG. 6 is a graph illustrating a simulated specific resistance along an axial position of a CZ grown silicon ingot with respect to different ratios of boron and phosphorus added to the silicon melt.

FIG. 6 illustrates calculated specific resistance curves versus an axial position between opposite ends of a silicon ingot. Similar to the parameter curves illustrated in FIG. 5, the curves illustrated in FIG. 6 refer to different ratios of boron (B) and phosphorus (P), i.e. $F_{OB}/c_{OP}$ corresponding to the ratio of the total amount of boron that is constantly (relative to the pulling rate) added to the silicon melt divided by the initial volume of the melt ($F_{OB}$ in atoms/cm³) and an initial concentration of phosphorus in the melt ($c_{OP}$ in atoms/cm³).

Similar to the parameter curves illustrated in FIG. 5, the curves illustrated in FIG. 6 refer to values of $F_{OB}/c_{OP}$ of 0%, 10%, 20%, 30%, 40%, 50%. By adding boron to the melt during CZ growth and thereby adding a compensation dopant to the melt during the CZ growth, the method described with reference to FIGS. 1 to 4 allows for improving homogeneity of the specific resistance along the axial direction between opposite ends of the silicon ingot. Since use of silicon ingots for supplying wafers for manufacturing a semiconductor device may require small tolerances with respect to the specific resistance, e.g. for manufacturing of insulated gate bipolar transistors (IGBTs), for example, the method described with reference to FIGS. 1 to 4 allows for yield improvement.

Based on the method illustrated and described with respect to FIGS. 1 to 6, table 1 illustrates a maximum portion of the ingot along the axial direction having a specific fluctuation of specific resistance and a specific ratio of boron (B) and phosphorus (P), i.e. $F_{OB}/c_{OP}$ corresponding to the ratio of the total amount of boron that is constantly (relative to the pulling rate) added to the silicon melt divided by the initial volume of the melt ($F_{OB}$ in atoms/cm$^3$) and an initial concentration of phosphorus in the melt ($c_{OP}$ in atoms/cm$^3$). Table 1 refers to values of $F_{OB}/c_{OP}$ of 0%, 10%, 20%, 30%, 40%, 50%, and to axial fluctuations of the specific resistance of +/-5%, +/-10%, +/-15%, +/-20%, +/-30%, +/-50%. By adding boron to the melt during CZ growth and thereby adding a compensation dopant to the melt during the CZ growth, the method described with reference to FIGS. 1 to 6 allows for a yield improvement by increasing the maximum portion of the ingot along the axial direction having a specific fluctuation of specific resistance. As an example, the axial portion of the ingot having a fluctuation of specific resistance of +/-10% may be increased from 26% (no compensation doping) to 78% (compensation doping $F_{OB}/c_{OP}$ of 40%).

TABLE 1

| boron compensation flow/initial doping with phosphorous | maximum ingot length with axial fluctuation of specific resistance of | | | | | |
|---|---|---|---|---|---|---|
|  | +/- 5% | +/- 10% | +/- 15% | +/- 20% | +/- 30% | +/- 50% |
| no compensation | 14% | 26% | 36% | 46% | 60% | 80% |
| 20% | 32% | 48% | 58% | 66% | 76% | 88% |
| 30% | 56% | 66% | 74% | 78% | 84% | 92% |
| 35% | 66% | 74% | 78% | 82% | 86% | 92% |
| 40% | 38% | 78% | 82% | 84% | 88% | 92% |
| 45% | 22% | 44% | 84% | 86% | 88% | 94% |

According to the method illustrated with respect to FIGS. 5 to 6, boron is constantly added (relative to the pulling rate) to the silicon melt (described by the term $F_{OB}$ in atoms/cm$^3$) and phosphorus is added as an initial concentration to the melt (described by the term $c_{OP}$ in atoms/cm$^3$). According to other embodiments, boron may be added to the melt at an altering rate. Apart from or in addition to phosphorus, other n-type dopant materials such as antimony or arsenic may be used.

In addition to adding boron to the melt during CZ growth a part of the overall boron may also be added to the melt before CZ growth which may be described by a term $c_{OP}$ in equation (1). Likewise, in addition to adding phosphorus or another n-type dopant material as an initial concentration to the melt, a part of the phosphorus or the other n-type dopant may also be added to the melt during CZ growth which may be described by a term $F_{OP}$ in equation (1) in case of constantly adding the phosphorus or the other n-type dopant material relative to the pulling rate.

According to an embodiment of an n-doped silicon ingot, the silicon ingot comprises, along an axis between opposite ends of the silicon ingot, partial compensation where donors outnumber boron, and a segregation coefficient of at least one n-type dopant species of the donors is smaller than the segregation coefficient of boron.

According to an embodiment, the n-doped silicon ingot comprises a doping concentration of boron in a range of $5 \times 10^{12}$ cm$^{-3}$ and $3 \times 10^{16}$ cm$^{-3}$, or in a range of $5 \times 10^{12}$ cm$^{-3}$ and $2 \times 10^{14}$ cm$^{-3}$, or even in a range of $1 \times 10^{13}$ cm$^{-3}$ and $1 \times 10^{14}$ cm$^{-3}$. Thus, boron is added to the silicon ingot at a doping concentration in the above range(s).

According to another embodiment, the n-doped silicon ingot comprises a doping concentration of phosphorus in a range of $8 \times 10^{12}$ cm$^{-3}$ and $5 \times 10^{16}$ cm$^{-3}$, or in a range of $1 \times 10^{13}$ cm$^{-3}$ and $4 \times 10^{14}$ cm$^{-3}$, or even in a range of $2 \times 10^{13}$ cm$^{-3}$ and $1 \times 10^{14}$ cm$^{-3}$. Thus, phosphorus is added to the silicon ingot at a doping concentration in the above range(s).

According to yet another embodiment, a profile of a specific resistance along an axis between opposite ends of the silicon ingot includes a maximum.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of magnetic Czochralski (MCZ) growth of an n-type MCZ silicon ingot, the method comprising:
    melting a mixture of silicon material suitable for manufacturing of power semiconductor transistors and phosphorus as an n-type dopant material in a crucible;
    extracting the MCZ silicon ingot with a diameter of 200 mm or more from the molten silicon over an extraction time period; and
    adding boron to the molten silicon over at least part of the extraction time period,
    thereby partially compensating the n-type doping of the MCZ silicon ingot, the n-type doping of the MCZ silicon ingot being set in a range from $1 \times 10^{13}$ cm$^{-3}$ to $4 \times 10^{14}$ cm$^{-3}$,
    wherein altering the rate of adding the boron to the molten silicon includes at least one of altering a depth of a source material dipped into the molten silicon and altering a temperature of the source material, wherein the source material is doped with the boron wherein doping of the source material is carried out by one of in-situ doping, by a plasma deposition process through a surface of the source material, by ion implantation through the surface of the source material and by a diffusion process through the surface of the source material, wherein a segregation coefficient of the n-type dopant material is smaller than a segregation coefficient of boron.

2. The method of claim 1, further comprising controlling a rate of adding the boron to the molten silicon by measuring a weight of the silicon ingot during the Czochralski growth process.

3. The method of claim 1, further comprising controlling a rate of adding the boron to the molten silicon by optically measuring a change in dimensions of a quartz source material doped with the boron.

4. The method of claim 1, wherein boron is added to the silicon ingot at a doping concentration in a range of $5 \times 10^{12}$ $cm^{-3}$ and $3 \times 10^{16}$ $cm^{-3}$.

5. The method of claim 1, wherein phosphorus is added to the silicon ingot at a doping concentration in a range of $8 \times 10^{12}$ $cm^{-3}$ and $5 \times 10^{16}$ $cm^{-3}$.

6. A method of magnetic Czochralski (MCZ) growth of an n-type MCZ silicon ingot, the method comprising:

melting a mixture of silicon material suitable for manufacturing of power semiconductor transistors and phosphorus as an n-type dopant material in a crucible;

extracting the MCZ silicon ingot with a diameter of 200 mm or more from the molten silicon over an extraction time period;

adding boron to the molten silicon over at least part of the extraction time period, thereby partially compensating the n-type doping of the MCZ silicon ingot, the n-type doping of the MCZ silicon ingot being set in a range from $1 \times 10^{13}$ $cm^{-3}$ to $4 \times 10^{14}$ $cm^{-3}$, wherein the boron is added to the molten silicon from a boron doped crucible.

7. The method of claim 6, wherein the boron doped crucible is formed by at least one of implanting boron into the crucible, diffusion of boron into the crucible and in-situ doping.

8. The method of claim 7, wherein the boron is implanted into the crucible at various energies.

9. The method of claim 7, wherein the boron is implanted into the crucible at various doses.

10. The method of claim 6, further comprising applying a thermal budget to the crucible by heating that is configured to set a retrograde profile of the boron in the crucible.

11. The method of claim 6, further comprising forming a layer at inner walls of the crucible.

* * * * *